(12) United States Patent
Dasgupta et al.

(10) Patent No.: US 6,545,502 B1
(45) Date of Patent: Apr. 8, 2003

(54) HIGH FREQUENCY MOS FIXED AND VARIABLE GAIN AMPLIFIERS

(75) Inventors: Uday Dasgupta, Singapore (SG); Wooi Gan Yeoh, Singapore (SG)

(73) Assignees: Institute of Microelectronics, Singapore (SG); Oki Techno Centre (Singapore) Pte. Ltd, Singapore (SG)

( * ) Notice: Subject to any disclaimer, the term of this patent is extended or adjusted under 35 U.S.C. 154(b) by 0 days.

(21) Appl. No.: 10/036,597

(22) Filed: Nov. 9, 2001

(51) Int. Cl.[7] .............................................. H03K 17/16
(52) U.S. Cl. ............................ 326/21; 326/83; 327/382
(58) Field of Search ............................. 326/21, 82, 83; 327/382; 330/252, 253, 292, 295, 310

(56) References Cited

U.S. PATENT DOCUMENTS

| | | | | |
|---|---|---|---|---|
| 4,710,728 A | * | 12/1987 | Davis | 330/252 |
| 5,420,524 A | * | 5/1995 | Webster | 326/21 |
| 5,880,631 A | | 3/1999 | Sahota | 330/51 |
| 5,949,286 A | | 9/1999 | Jones | 330/254 |
| 6,084,469 A | * | 7/2000 | Lorenz | 330/252 |
| 6,111,463 A | | 8/2000 | Kimura | 330/254 |
| 6,229,955 B1 | | 5/2001 | Kay | 330/252 |

* cited by examiner

*Primary Examiner*—Daniel D. Chang
(74) *Attorney, Agent, or Firm*—George O. Saile; Stephen B. Ackerman

(57) ABSTRACT

A high frequency differential amplifier with a circuit topology which ensures that bias currents of the high transconductance differential transistors with minimum channel length are exactly equal, i.e., each differential transistor carries exactly half of the total current $I_0$ of the differential amplifier. This is achieved by coupling each differential transistor via its own current source to the reference potential. To insure a good match between the current sources, the current source devices are made with long channel lengths. Impedances are coupled between the junctions of each differential transistor pair and its current source to insure good AC gain. For the variable gain differential amplifier the spread in the gain control characteristics is reduced by making the aspect ratio of the first pair of differential transistors larger than that of the second pair of differential transistors.

41 Claims, 16 Drawing Sheets

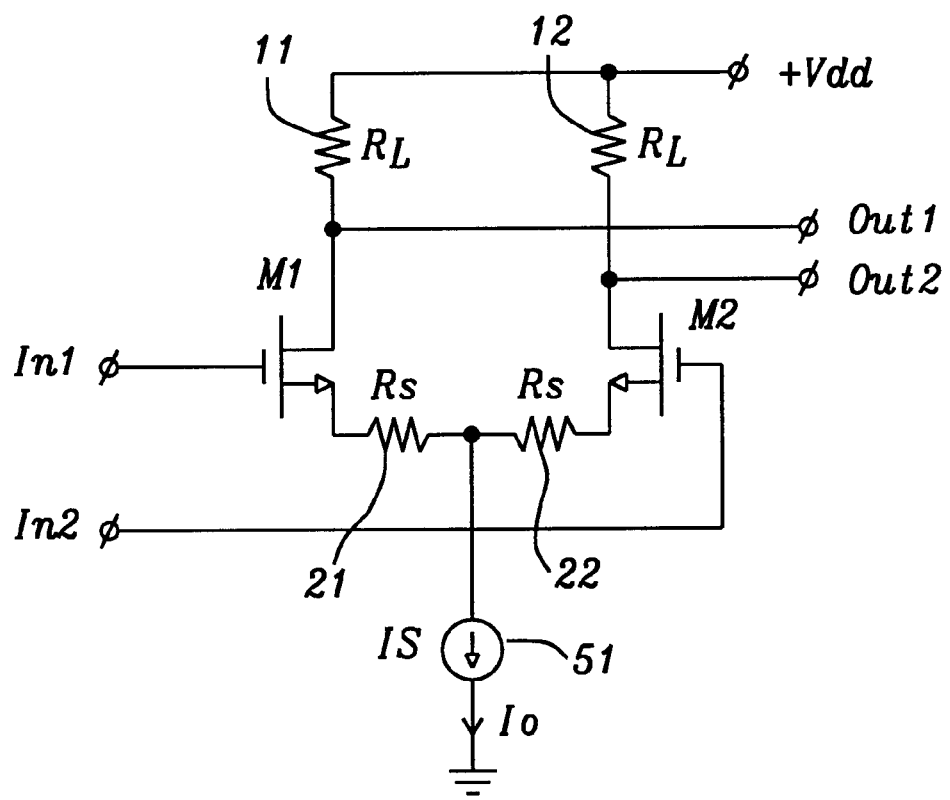
FIG. 1 - Prior Art

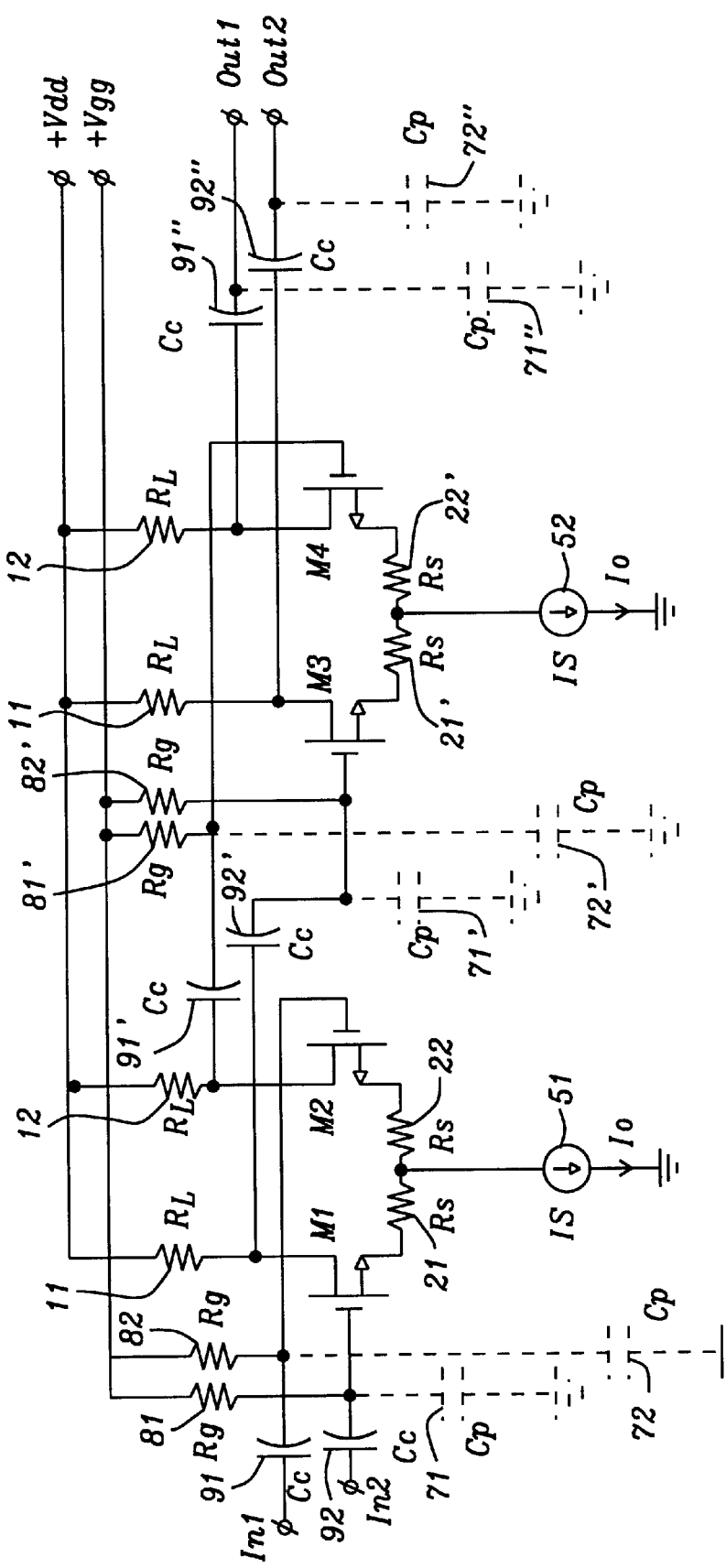
FIG. 2 – Prior Art

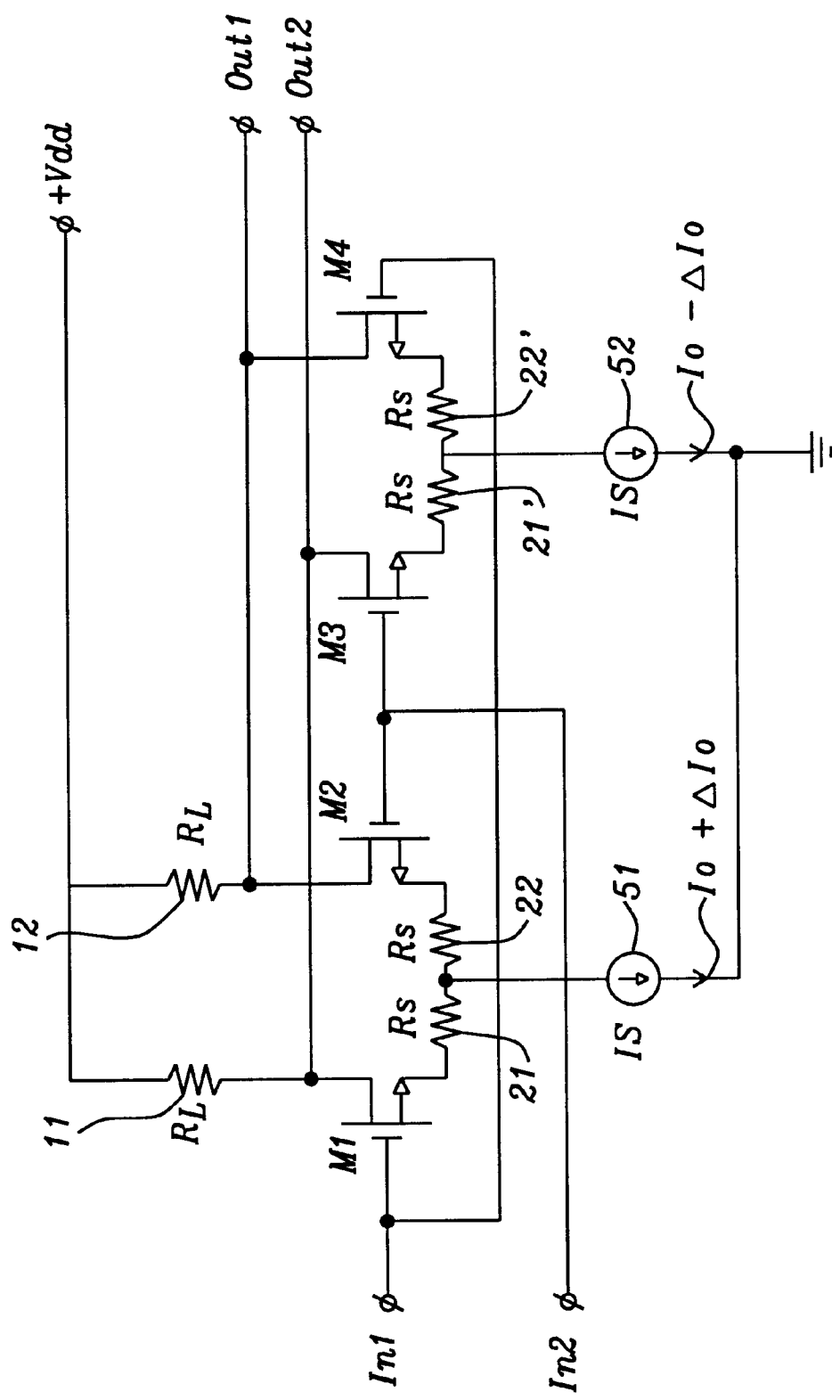
FIG. 3 – Prior Art

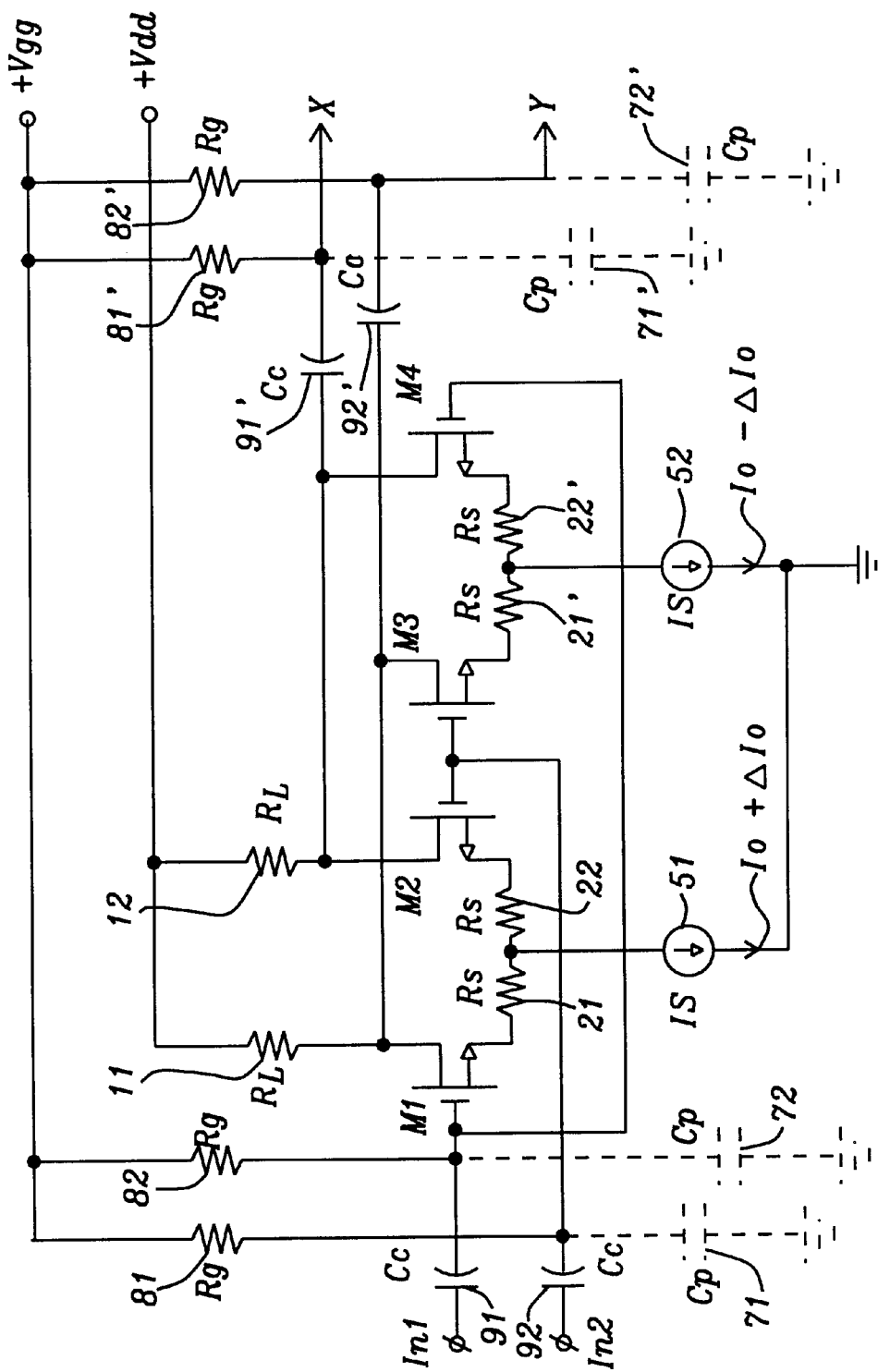
FIG. 4a – Prior Art

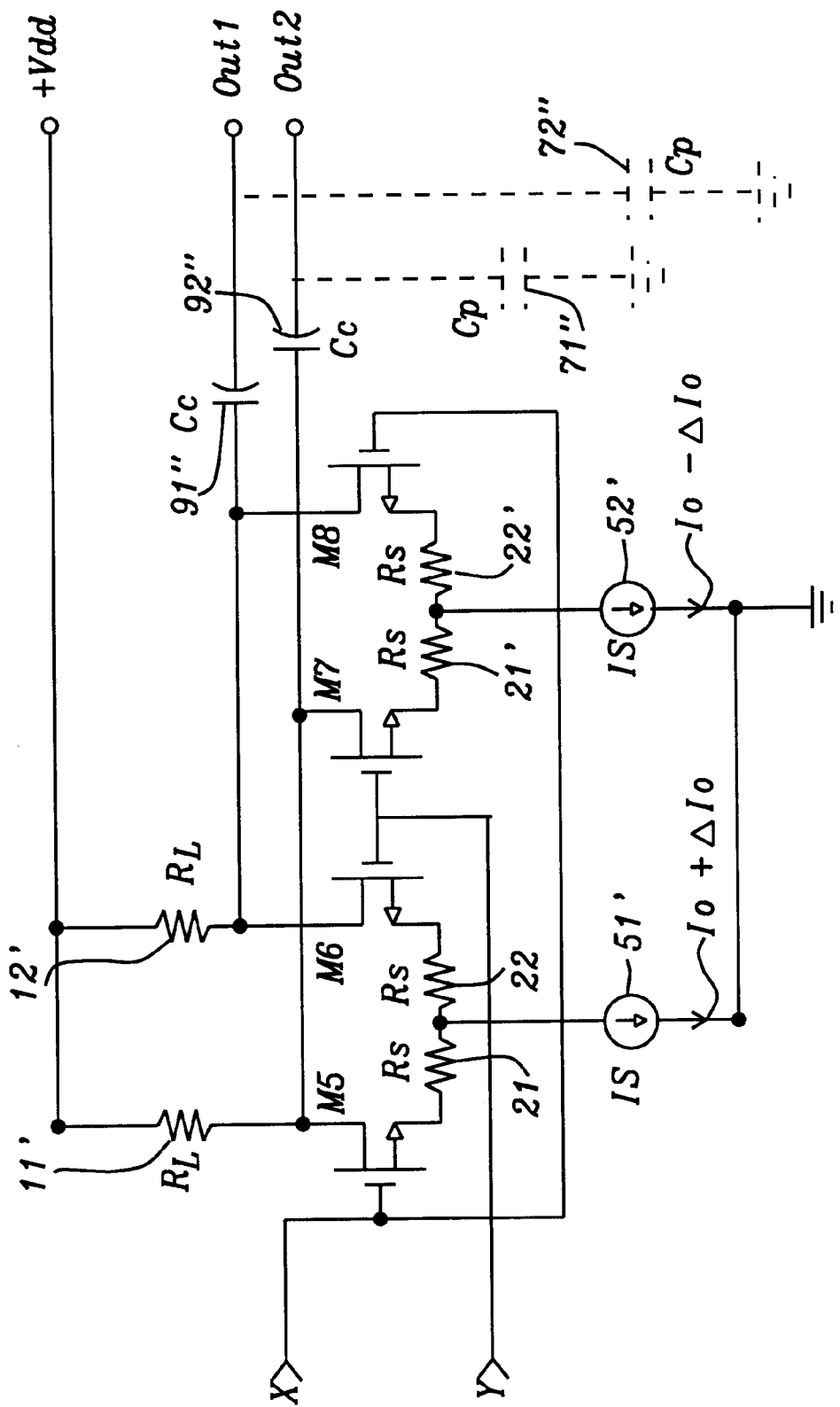
FIG. 4b – Prior Art

HIGH FREQUENCY MOS FIXED AND VARIABLE GAIN AMPLIFIERS

BACKGROUND OF THE INVENTION

1. Field of the Invention

The invention relates to high frequency differential amplifiers and more particularly to high frequency MOS differential amplifiers having high transconductance, matched differential devices, and minimal DC offset at the output.

2. Description of the Related Art

While designing high frequency amplifiers in MOS technology, designers are often forced to use small or even the minimum channel length of the technology for the amplifier transistors. This is needed to meet the high transconductance required by the application. However, if the amplifier is differential, serious problems can be encountered. While using small channel lengths, the matching of the differential devices is poor due to etching inaccuracies in the channel length. This results in DC offsets, low common mode rejection ratio (CMRR) and poor differential performance. For variable gain amplifiers based on the Gilbert Cell, the mismatches can lead to a lot of spread in the variable gain characteristics. The nicely balanced performance of the Gilbert Cell is also affected.

FIGS. 1 and 3 show a high frequency fixed and a Gilbert Cell based variable gain amplifier, respectively, having inputs In1, In2 and outputs Out1, Out2. A power source $V_{DD}$ connects via two load resistors 11 and 12 ($R_L$) to the drain of M1, M2 and M3, M4. A series resistance 21, 22, 21', 22' ($R_S$) couples each transistor via a current source 51, 52 (IS), with current $I_0$ (for FIG. 3: $I_0+\Delta$, $I_0-\Delta I_0$), to ground. The current splits unequally between the differential transistors M1, M2 and M3, M4 if there are small differences in their channel lengths. This results in widely different transconductances between them and as a consequence the CMRR and differential and other balanced characteristics are spoilt. The unequal currents also cause DC offset at the amplifier outputs. As a result, the output signal handling capability is reduced.

FIGS. 2 and 4a, 4b show how multiple stages of such amplifier stages have to be connected. Capacitive coupling 91, 92, 91', 92', 91", 92", ($C_C$) between stages and at the input is used to prevent propagation and further amplification of DC offset appearing at the outputs of every amplifying stage. However, parasitic capacitances 71, 72, 71', 72", 71", 72", ($C_P$) on the bottom plate of the coupling capacitors $C_C$ load the outputs of the amplifier stages and this adversely affects the high frequency response of the overall amplifier. In addition, gate resistors 81, 82, 81', 82' ($R_G$) are coupled between a second power supply $V_{GG}$ and the inputs of each amplifier stage.

Transistors M1, M3 and M2, M4 of FIG. 4a are coupled via load resistors 11, 12 ($R_L$), respectively, to power supply $V_{DD}$. Transistors M5, M7 and M6, M8 of FIG. 4b are coupled via load resistors 11', 12' ($R_L$), respectively, to power supply $V_{DD}$.

Note that throughout this document the same numerals and characters designate the same component.

Since usage of minimum channel length devices cannot be ruled out for high frequency applications, a topology modification to the conventional differential amplifier structures is needed to minimize the above problems.

Related art referring to differential amplifiers and Gilbert Cells are: U.S. Pat. No. 5,880,631 (Sahota), U.S. Pat. No. 5,949,286 (Jones), U.S. Pat. No. 6,111,463 (Kimura), and U.S. Pat. No. 6,229,395 (Kay) all use a single current source for a differential transistor pair with the disadvantages discussed above.

It should be noted that none of the above-cited examples of the related art connect each differential transistor only to a current source and from there to a reference voltage nor do they insure that the bias current for each differential transistor is exactly $I_0/2$ of the transistor pair.

SUMMARY OF THE INVENTION

It is an object of at least one embodiment of the present invention to provide high frequency differential amplifier circuits and methods which utilize amplifier transistors using a small or minimum channel lengths of the technology.

It is another object of the present invention to provide high transconductance for those amplifier transistors.

It is yet another object of the present invention to provide excellent matching of the transconductance of the differential amplifier transistors.

It is still another object of the present invention to provide circuits and methods which are not sensitive to DC offsets at the inputs to those differential amplifiers.

It is a further object of the present invention to provide circuits and methods which do not cause DC offsets at the outputs of the differential amplifier.

It is yet a further object of the present invention to maintain good common mode rejection ratio (CMRR) at the signal frequencies of interest.

It is still a further object of the present invention to provide AC differential gains equal to those of the prior art.

It is lastly an object of the present invention to reduce the spread in the gain control characteristics for variable gain amplifiers.

These and many other objects have been achieved by a circuit topology which ensures that bias currents of the differential transistors are exactly equal, i.e., each differential transistor carries half of the total current $I_0$ of the differential amplifier. That is, the current in each differential transistor is $I_0/2$. To insure a good match between the current sources, the current source devices are made with long channel lengths. This causes the DC bias conditions to be perfectly determined and the circuits are not sensitive to DC offsets at the outputs. Another benefit is that the transconductance of the differential devices is nearly equal. Any small differences are due to slightly different aspect ratios. The spread in the gain control characteristics for the variable gain differential amplifier can also be further reduced by making the aspect ratio of the first transistor pair larger than that of the second transistor pair. To insure good AC gain, impedances are coupled between the junctions of each differential transistor pair and its current source.

These and many other objects and advantages of the present invention will be readily apparent to one skilled in the art to which the invention pertains from a perusal of the claims, the appended drawings, and the following detailed description of the preferred embodiments.

In the following, first and second conductivity types are opposite conductivity types, such as N and P types. Each embodiment includes its complement as well.

BRIEF DESCRIPTION OF THE DRAWINGS

FIG. 1 is a circuit diagram of a high frequency fixed gain differential amplifier of the prior art.

FIG. 2 is a circuit diagram of a multistage high frequency fixed gain differential amplifier of the prior art.

FIG. 3 is a circuit diagram of a high frequency variable gain differential amplifier of the prior art.

FIGS. 4a and 4b are circuit diagrams of a multistage high frequency variable gain differential amplifier of the prior art.

DESCRIPTION OF THE PREFERRED EMBODIMENT

Figure 5:
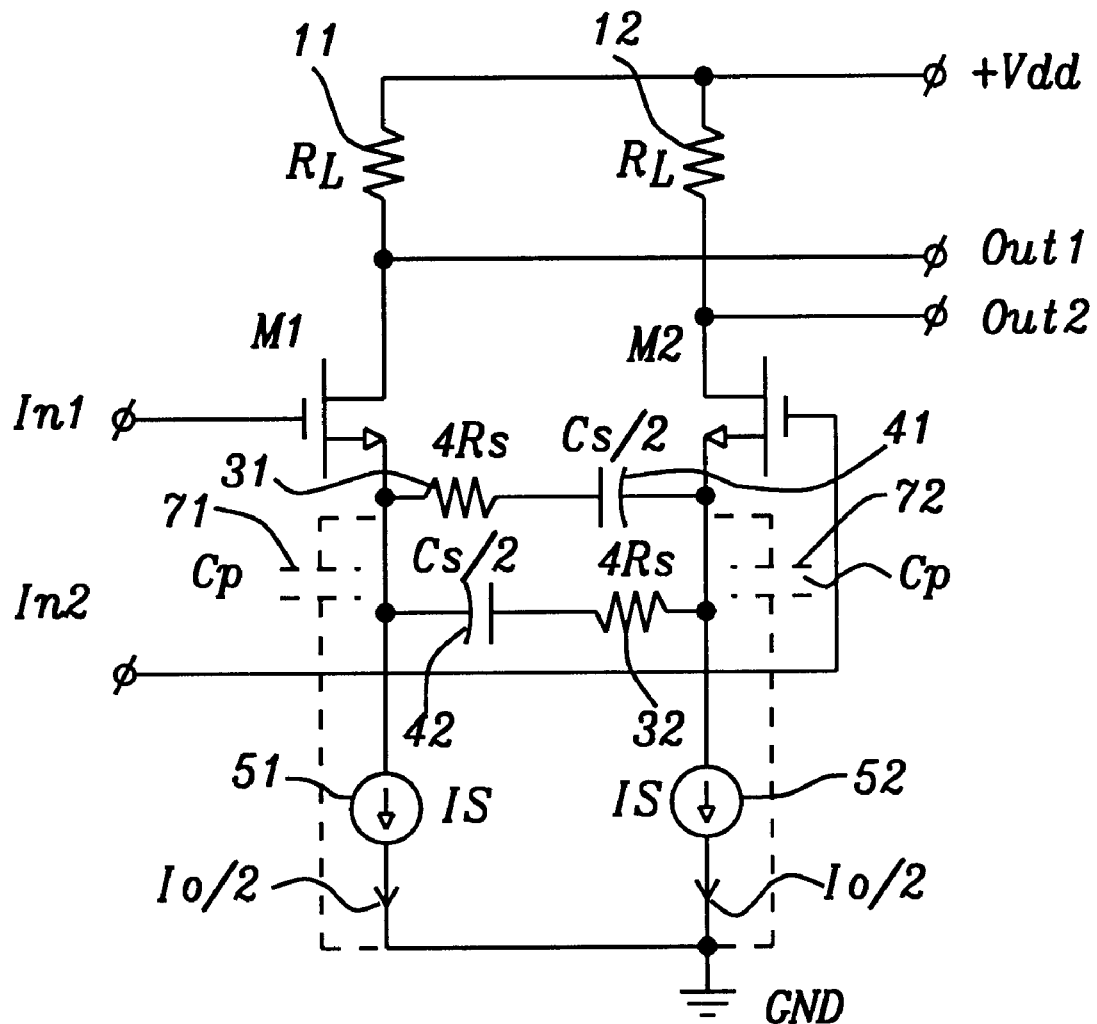
FIG. 5 is a circuit diagram of a high frequency fixed gain differential amplifier of the preferred embodiment of the present invention.
Figure 7:
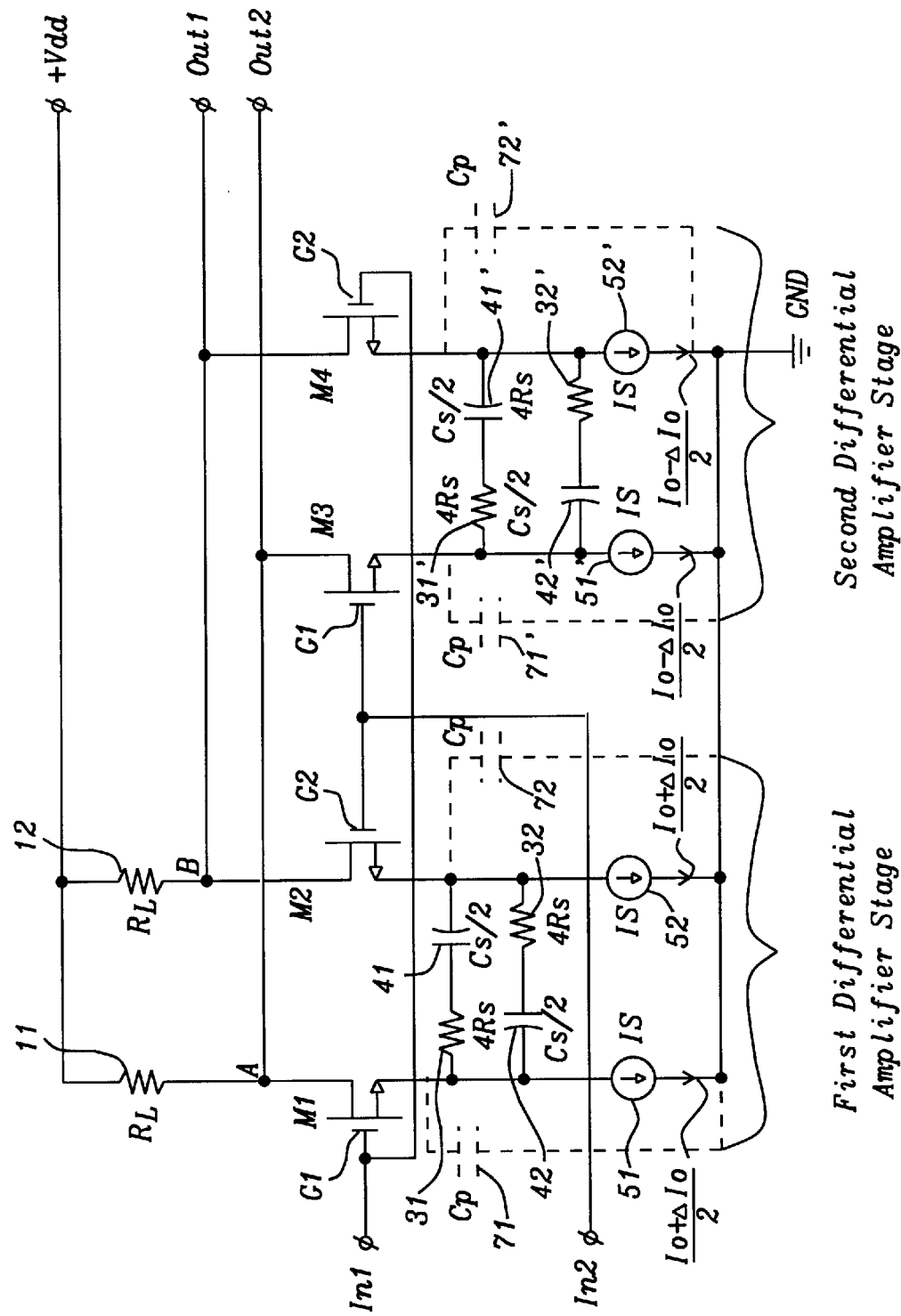
FIG. 7 is a circuit diagram of a high frequency variable gain differential amplifier of the preferred embodiment of the present invention.

FIGS. 5 and 7 show the improved and modified topology corresponding to FIGS. 1 and 3 respectively. It can be observed that for the new topology, the bias currents are exactly equal to $I_0/2$ each—exactly what is required. The current sources 51, 51' and 52, 52' (IS), each with current $I_0/2$, can be implemented with long channel length devices to ensure good matching between them. In such a case, there is also no DC offset at the outputs. In other words, the DC bias conditions are perfectly determined. It can also be observed that the circuits are not sensitive to DC offsets at the inputs.

The transconductance $g_m$ of the differential devices is nearly equal and the difference between the transconductances is not greater than 2.5%. The 2.5% is based on the fact that a difference in L (the length of the transistor channel) causes the threshold voltage $V_{TH}$ of the differential transistors to be different. The smaller L is, the smaller $V_{TH}$ is. With equal $V_{GS}$ (the gate-source voltage), the current $I_D$ (drain current of the transistor) can be different by about 15–20% for a 5% difference in L. For equal $I_D$, the transconductance difference is 2.5% for a 5% difference in L—which is about the maximum expected. Therefore, good common mode rejection ratio (CMRR) and other differential and balanced characteristics can be maintained at signal frequencies. The AC differential gains are also the same as in FIGS. 1 and 2, provided the impedance of 41, 41' and 42, 42' ($C_S/2$) is small compared to that of series resistance 31, 31' and 32, 32' ($4R_S$) at signal frequency. Parasitic capacitances 71, 71' and 72, 72' ($C_P$) at the bottom plate of $C_S/2$ actually help to improve the high frequency response of the amplifiers by reducing the impedance at the sources of the differential transistors.

Due to reduction in the differences in transconductances, the spread in the gain control characteristics for the variable gain amplifier is also reduced. This spread can be further reduced by making the aspect ratio of the M1–M2 pair larger than that of the M3–M4 pair of FIG. 7.

Figure 6:
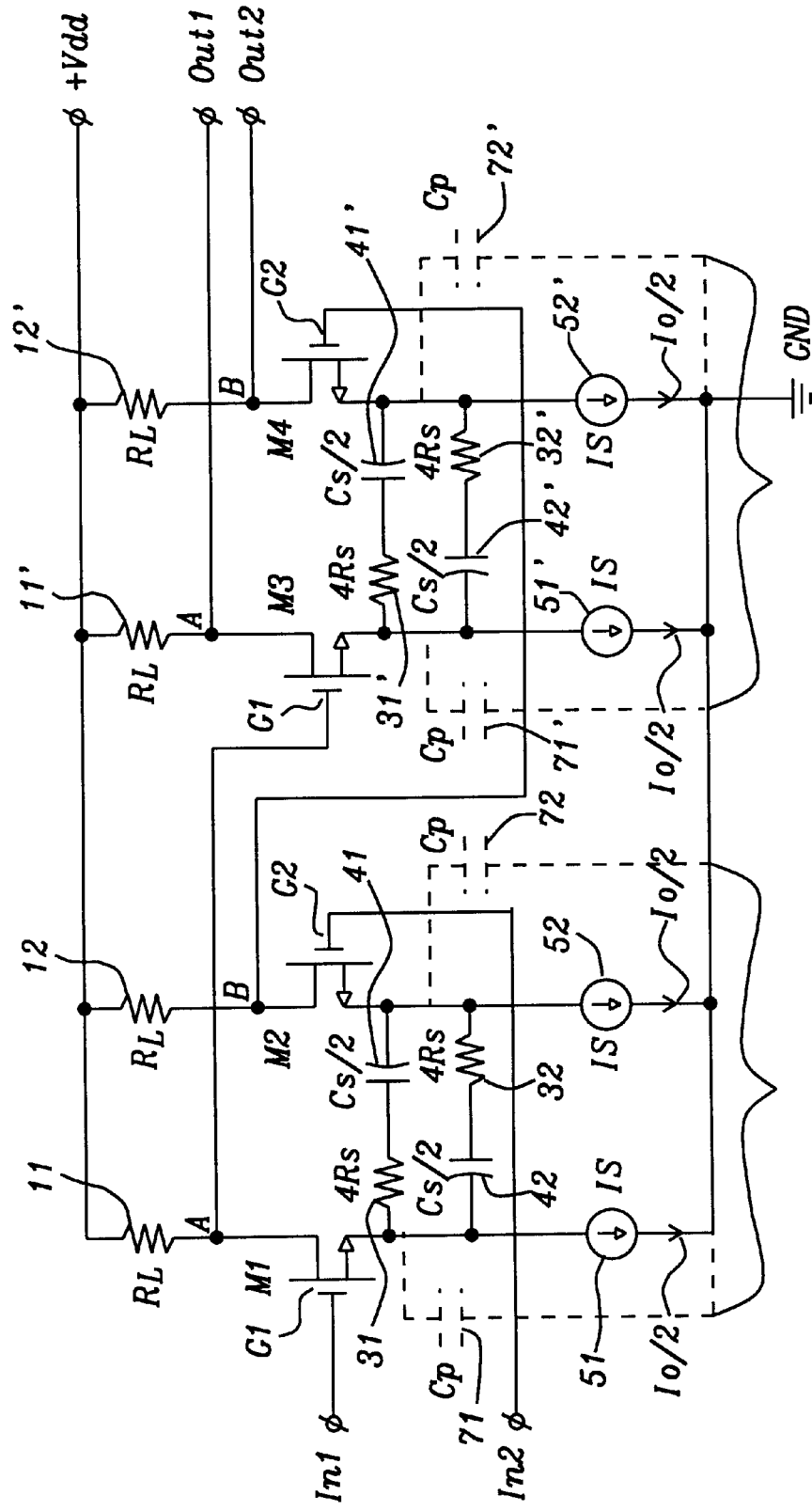
FIG. 6 is a circuit diagram of a multistage high frequency fixed gain differential amplifier of the preferred embodiment of the present invention.

FIGS. 6 and 8 show how multiple stages of the new amplifiers can be cascaded. Since the circuits are not sensitive to DC offsets at their outputs and inputs, direct coupling can be employed. This saves layout area and also does not degrade the high frequency response of the overall amplifier as does the related art in FIGS. 2 and 4. Simulations performed for all of the inventive circuits described above have verified the above claims and findings.

We now describe in more detail the circuit of FIG. 5 which is a modified Gilbert Cell differential amplifier. The drain of a first NMOS transistor is coupled via a first load resistor 11 ($R_L$) to a positive power supply $V_{DD}$, where the junction of M1 and the first resistor 11 provides a first output Out1. The source of transistor M1 is coupled via a first current source 51, with current $I_0/2$ to a second power supply GND (typically ground) less positive than the first power supply. A second NMOS transistor M2, designed to be identical to transistor M1, is similarly connected via a second load resistor 12 ($R_L$), equal in resistance to first resistor 11, to power supply $V_{DD}$, where the junction of M2 and the second resistor 11 provides a second output Out2. The source of transistor M2 is coupled via a second current source 52 (IS) and current $I_0/2$, identical to first current source 51, to GND. Gates of transistors M1, M2 are in communication with first and second input terminals In1, In2, respectively. Outputs Out1 and Out2 provide a fixed gain differential output signal based on a first and a second input signal applied to input terminals In1 and In2. As already discussed earlier, current sources IS are implemented in long channel length transistors thus minimizing the effects of channel length variations, thereby generating equal bias currents in all current sources. This requirement applies equally to all subsequently disclosed differential amplifier circuits as illustrated in FIG. 6 to FIG. 10, wherein the first and second current sources IS of the second differential amplifiers have the reference characters 51' and 52', respectively.

Frequency compensating means are connected between the sources of transistors M1 and M2. These frequency compensating means may comprise two capacitors 41 and 42 ($C_S/2$), where the bottom plate of each capacitor is connected to the source of M1 and M2, as illustrated in FIG. 9, or it may comprise two circuits each consisting of a series resistor 31 or 32, 31', 32' ($4R_S$) in series with capacitor 41 or 42, 41', 42' ($C_S/2$), respectively, serially connected between M1 and M2, M3 and M4, M5 and M6, M7 and M8, as illustrated in FIG. 5 to FIG. 8. The bottom plate of the first capacitor 41 is connected to the source of M1 and the bottom plate of the second capacitor 42 is connected to the source of M2. The value of each capacitor $C_S/2$ is:

$$C_S/2 \gg \frac{1}{8\pi\left(R_S + \dfrac{1}{g_m}\right)f_S}$$

where $R_S$ is the resistance of the source of a MOS transistor, $f_S$ is the signal frequency, and $g_m$ is the transconductance of either M1 or M2.

Parasitic capacitances 71, 71' and 72, 72' ($C_P$) are coupled between the plates of first and second capacitors 41, 41' and 42, 42', respectively, and ground (GND) and are illustrated in FIG. 5 to FIG. 10 where the transistors shown are NMOS transistors. It is understood by those skilled in the art that PMOS transistors could be used as well, in which case the sources will be substituted by drains and vice versa. Other types of switching devices can be used as well such as, but not limited to, npn or pnp bipolar transistors. The term channel length with reference to current sources will then have to be replaced by an equivalent device parameter.

FIG. 6 illustrates a multistage high frequency fixed gain differential metal oxide semiconductor (MOS) amplifier which comprises inputs In1 and In2 and outputs Out1 and Out2, and a first and a second differential amplifier stage, each of these stages and inputs and outputs identical to the amplifier of FIG. 5. The only difference is that the transistors of the second stage are labeled M3 and M4 for ease of identification. In addition, transistors M3 and M4 are coupled via resistors 11' and 12' ($R_L$) to power supply $V_{DD}$. The two stages are coupled together by direct-coupling of the gate G1 and G2 of M3 and M4 to node A and node B of the first differential amplifier, respectively. Inputs G1, G2 of the first differential amplifier stage are coupled to inputs In1, In2, respectively. Nodes A, B of the second differential amplifier stage are coupled to outputs Out1, Out2, respectively. The two differential amplifier stages together provide a fixed gain at outputs Out1, Out2 based on signals applied to inputs In1, In2.

FIG. 7 illustrates a high frequency variable gain differential metal oxide semiconductor (MOS) amplifier which comprises a first and a second differential amplifier stage, each having an input G1 and G2 and outputs node A and node B. Both output nodes A are coupled together and output nodes B are coupled together. Both stages are similar to the differential amplifier circuit of FIG. 5 except that nodes A share a load resistor 11 ($R_L$) and that nodes B share a load resistor 12 ($R_L$). Identical to FIG. 5 is the arrangement of the frequency compensating means and the parasitic capacitors 71, 71' and 72, 72' ($C_P$). As in FIG. 6, the transistors of the second stage are labeled M3 and M4 for ease of identification. Inputs G1 and G2 of the first differential amplifier stage are coupled to inputs In1 and In2, respectively. Inputs G1 and G2 of the second differential amplifier stage are coupled to inputs In2 and In1, respectively, i.e., in reverse order. Nodes B and A are coupled to outputs Out1 and Out2, respectively. Each node A and B is coupled via a load resistor 11 and 12, respectively, to a power supply $V_{DD}$. The first and second differential amplifier stage together provide a variable gain at outputs Out1 and Out2 for the signals applied to inputs In1 and In2.

The aspect ratio of the M1–M2 pair is larger than that of the M3–M4 pair in FIG. 7 as discussed earlier. Th relationship is:

$$\left(\frac{W}{L}\right)M1 = \left(\frac{W}{L}\right)M2 = m\left(\frac{W}{L}\right)M3 = m\left(\frac{W}{L}\right)M4$$

where W is the width and L is the length of a MOS transistor channel, and where M1, M2, M3, and M4 designate the transistors of the circuit of FIG. 7.

Typically, m ranges from 2 to 6. This range is derived as follows. Let aspect ratios of M1, M2 be m(W/L) and those of M3, M4 be (W/L). The transconductance of a MOS transistor is given by $$g_m = \sqrt{2I_D \mu C_{OX} W/L} \qquad (1)$$

using eq. (1), the gain of the variable amplifier is given by $$Av = (g_{m1} - g_{m3})R_L = g_{m0}R_L\left[\sqrt{m} - \sqrt{\frac{I_0 - \Delta I_0}{I_0 + \Delta I_0}}\right] \qquad (2)$$

where $$g_{m0} = \sqrt{(I_0 + \Delta I_0)\mu C_{OX} W/L} \qquad (3)$$

It is seen from eq. (2) that the gain Av is a function of $\Delta I_0$. From eq. (2), the maximum value of Av is $g_{m1}R_L$, when $\Delta I_{0max} = I_0$. From eq. (2), the minimum value of Av is 0, when $$\Delta I_{0min} = \frac{1-m}{1+m}I_0 \qquad (4)$$

The most sensitive part of the gain-control characteristic is just above Av=0 as the gain is a very strong function of $\Delta I_0$ there. Again, the circuitry which generates $\Delta I_0$ is not very accurate generating $\Delta I_0=0$ because of DC offsets. But (4) shows that for m=1, $\Delta I_{0min}=0$. That is why the gain spreads can be more for low Av, if m=1. However, if m=6, eq. (4) shows that $\Delta I_{0min}=-(5/7)I_0$ and the effect of gain spread is reduced at low gain. In this case, the condition $\Delta I_0=0$ happens at higher gain, where the gain-control characteristic is not a very strong function of $\Delta I_0$, and the effects of DC offset are not too great.

The aspect ratio of M1, M2 cannot be increased beyond a limit because its parasitic capacitance will increase, affecting high frequency operation. Therefore, those of M3, M4 have to be reduced by increasing m. It can also be observed from eq. (4) that $\Delta I_{0min}$ saturates at $-I_0$ for large values of m. The maximum value of m is also limited by the minimum dimensions allowed by the technology.

The currents flowing through the current sources IS of transistors M1 and M2 are equal and are:

$$\frac{I_0 + \Delta I_0}{2}$$

The currents flowing through the current sources IS of transistors M3 and M4 are equal and are:

$$\frac{I_0 - \Delta I_0}{2}$$

Figure 8A:
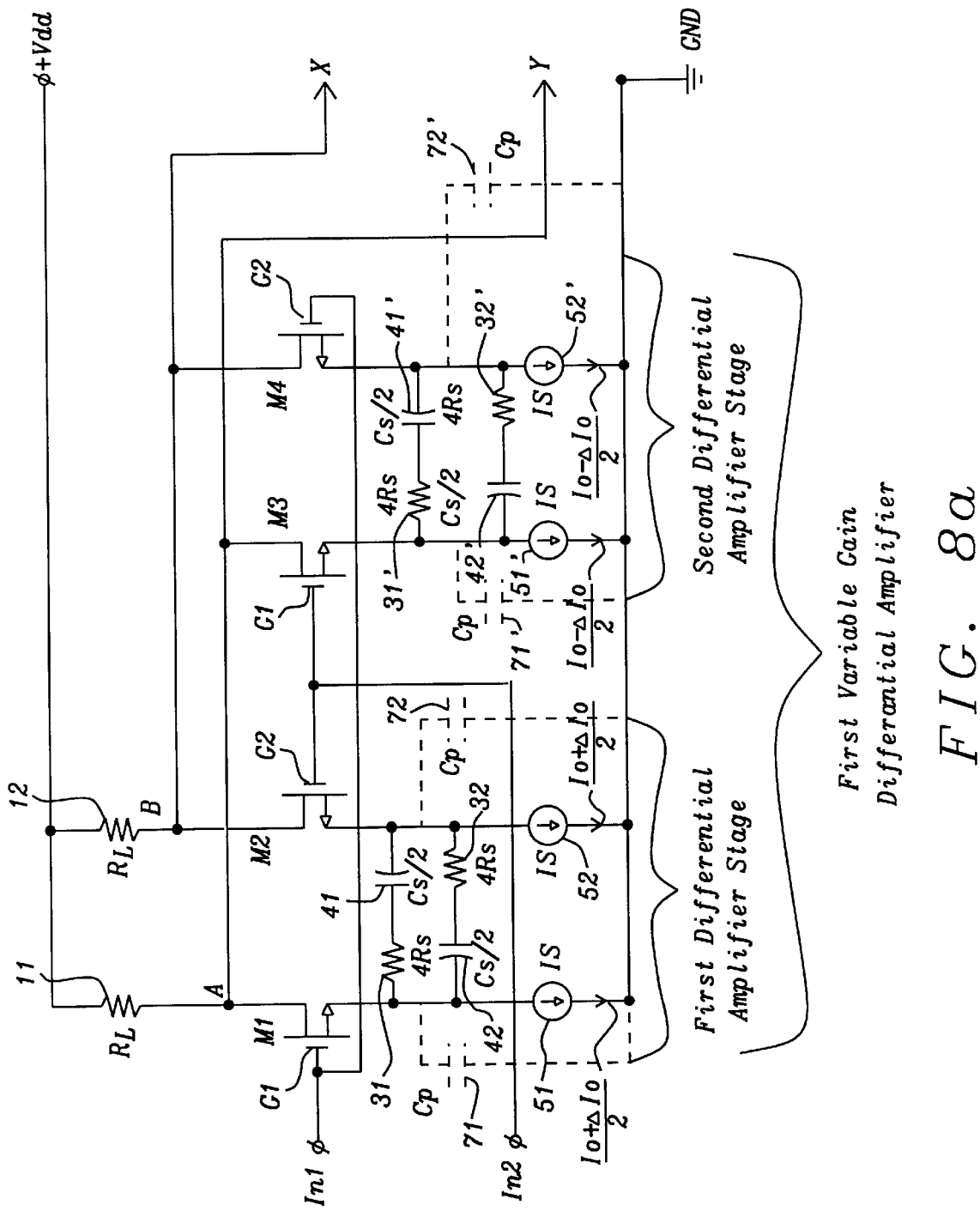
FIGS. 8a and 8b are circuit diagrams of a multistage high frequency variable gain differential amplifier of the preferred embodiment of the present invention.
Figure 8B:
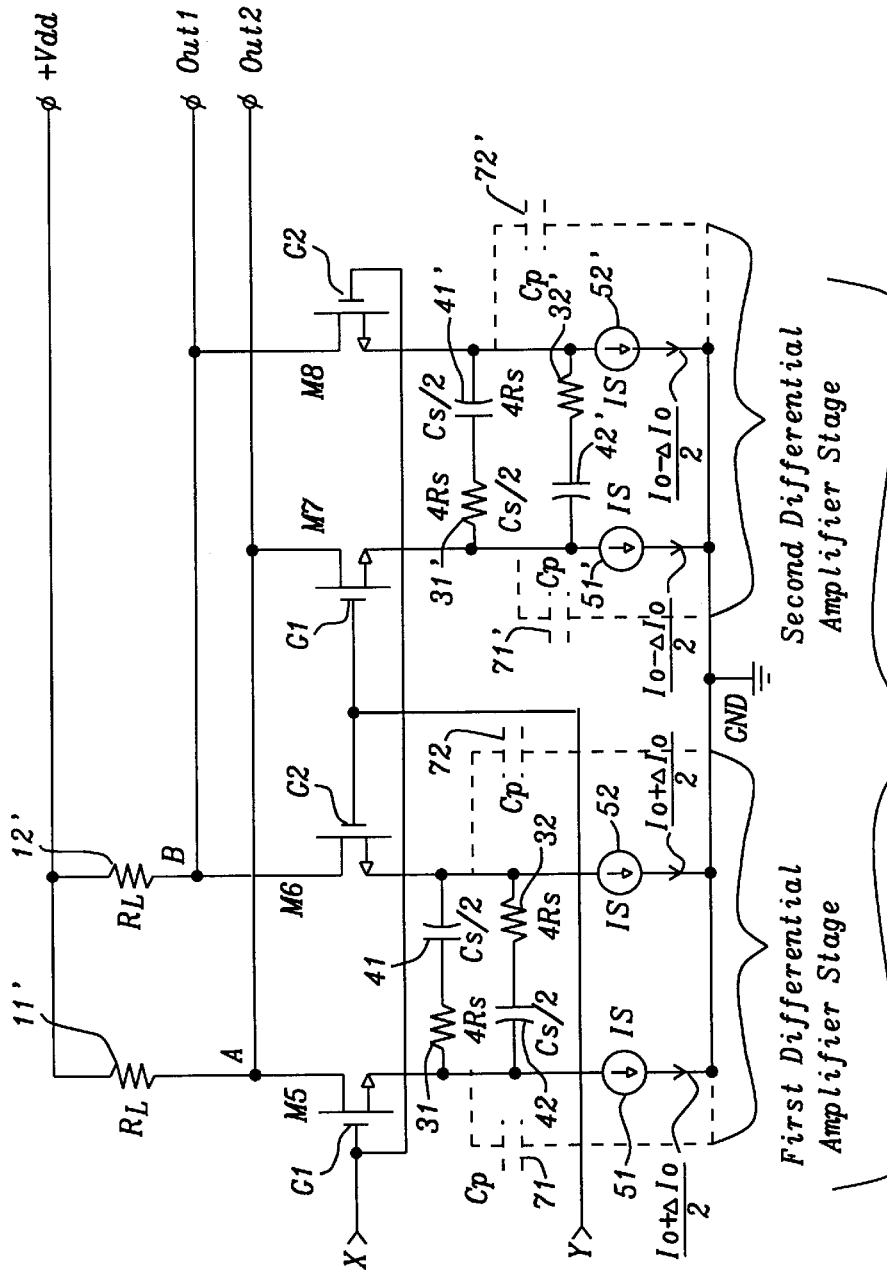
Figure 9:
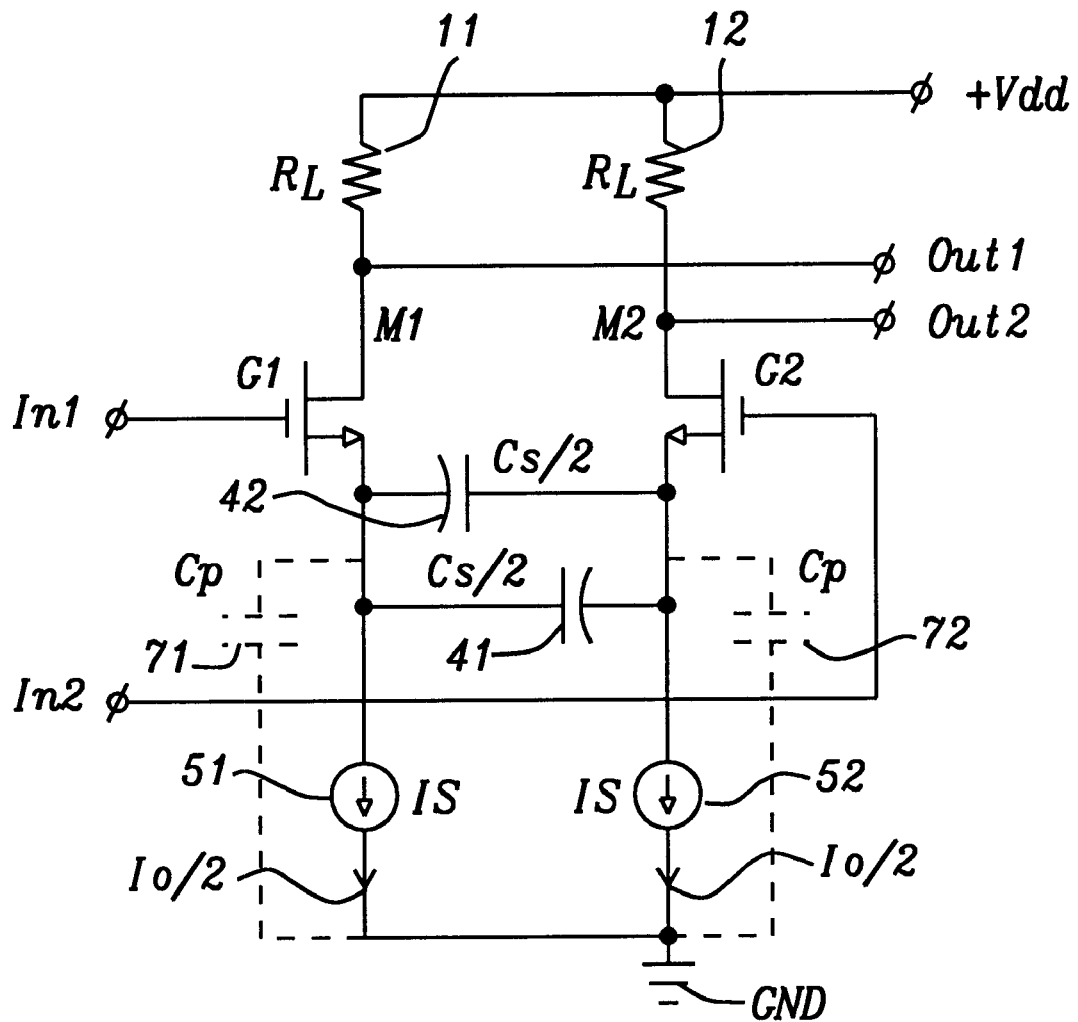
FIG. 9 is a special case of FIG. 5.

FIGS. 8a and 8b illustrate a multistage high frequency variable gain differential metal oxide semiconductor (MOS) amplifier which comprises a first variable gain differential amplifier (FIG. 8a) and a second variable gain differential amplifier (FIG. 8b), each identical to the circuit of FIG. 7. Gates G1 and G2 of transistors M1 and M2 of the first variable gain differential amplifier are connected to inputs In1 and In2, respectively. Gates G1 and G2 of transistors M5 and M6 of the second variable gain differential amplifier are direct-coupled to node B and node A of the first variable gain differential amplifier, respectively. Nodes B and A of the second variable gain differential amplifier are coupled to outputs Out1 and Out2, respectively. The first and second variable gain differential amplifier together provide a variable gain at outputs Out1 and Out2 for the signals applied to inputs In1 and In2. The currents flowing through the current sources IS of transistors M1 to M8 of both variable gain differential amplifiers are identical to those of the circuit of FIG. 7. The gain is varied by adjusting $\Delta I_0$ in the range $$\frac{1-m}{1+m}I_0 < \Delta I_0 < I_0$$

Figure 10:
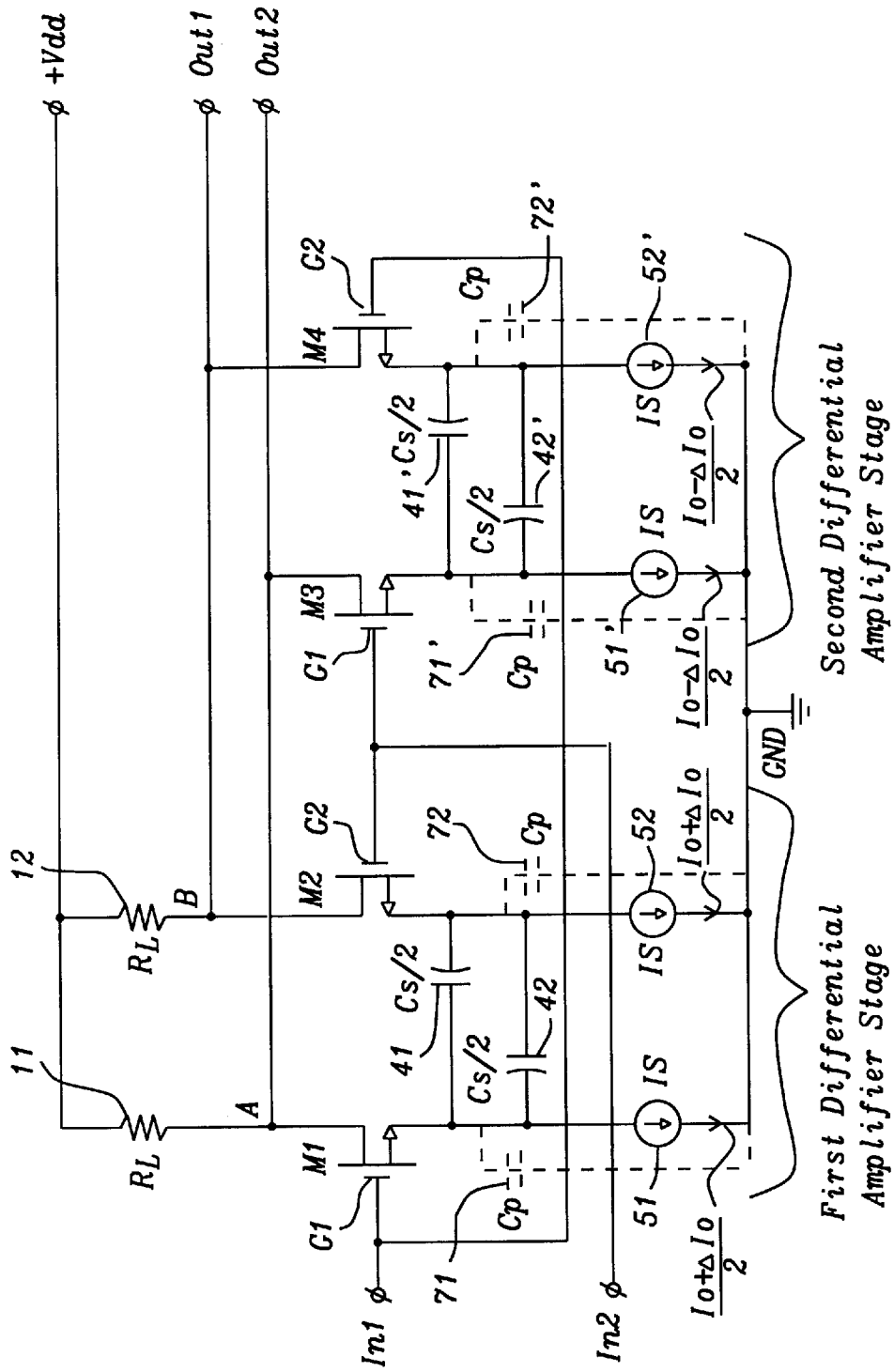
FIG. 10 is a special case of FIG. 7.

FIG. 9 and FIG. 10 are special cases of FIG. 5 and FIG. 7, respectively, where $R_S=0$. Everything else is the same.

Figure 13:
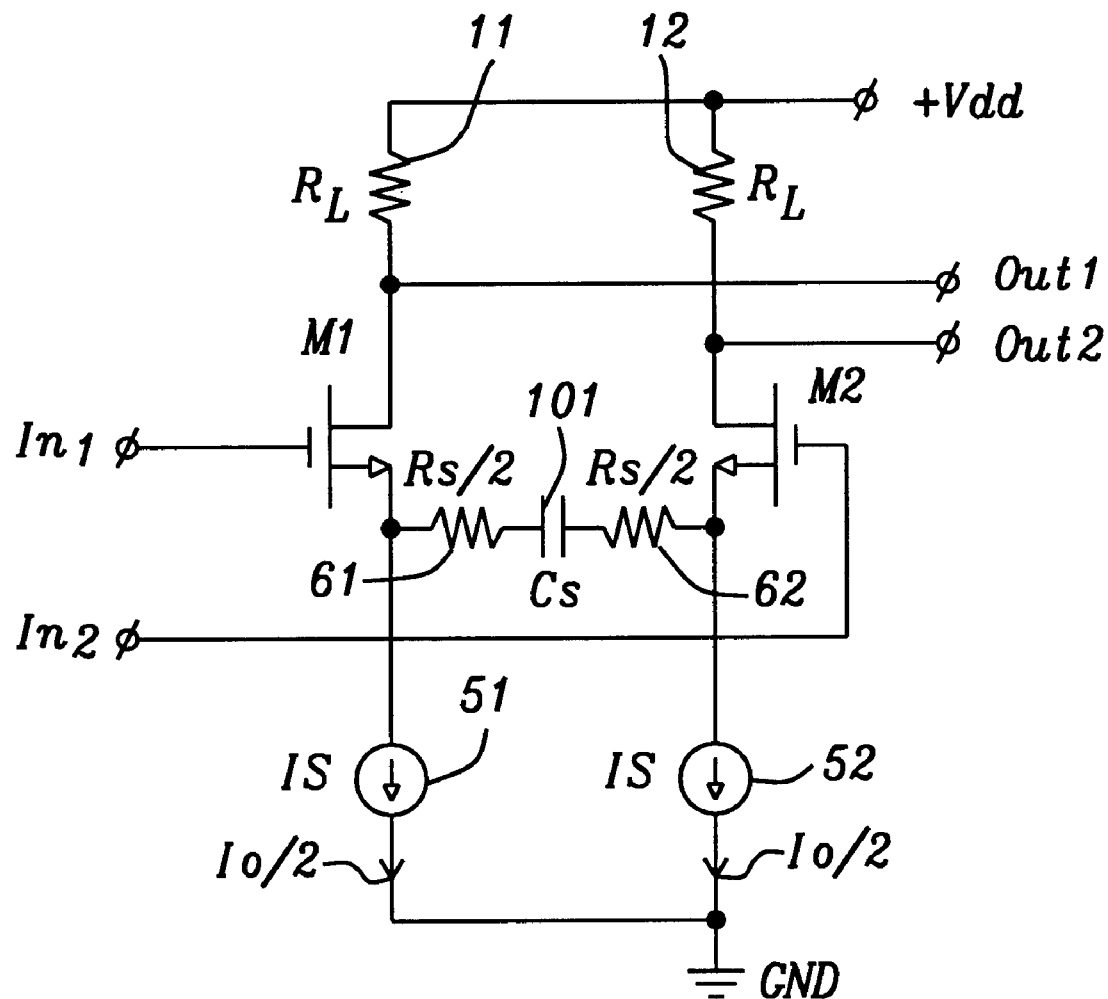
FIG. 13 is a circuit diagram of a high frequency fixed gain differential amplifier of another preferred embodiment of the present invention utilizing metal-insulator-metal (MIM) capacitors.
Figure 14:
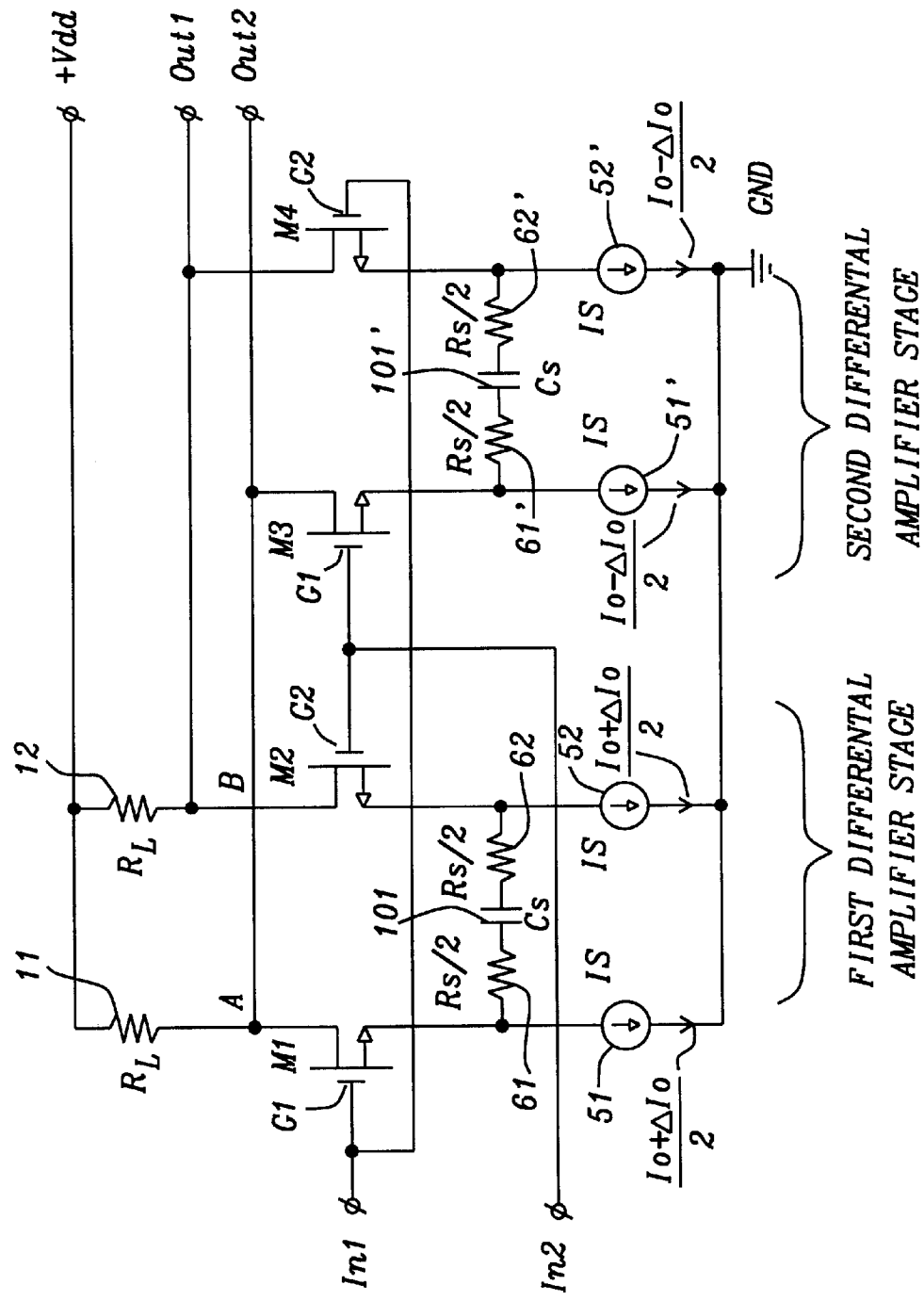
FIG. 14 is a circuit diagram of a high frequency variable gain differential amplifier of another preferred embodiment of the present invention utilizing MIM capacitors.

We now refer to FIG. 13 and FIG. 14, representing another preferred embodiment of the present invention. FIG. 13 is a variation of FIG. 5, and FIG. 14 is a variation of FIG. 7, where the frequency compensating means comprises a serial combination of a first series resistive means 61 (Rs/2), a capacitor 101 (Cs), and a second series resistive means 62 (Rs/2), respectively, coupled between the sources of transistors M1, M2 and with regards to FIG. 14 also between the sources of transistors M3, M4, where the frequency compensating means comprises series resistive means 61', capacitor 101', and series resistive means 62'. The embodiment as shown in FIG. 13 and FIG. 14 is the preferred embodiment for 0.35 $\mu$m and 0.18 $\mu$m CMOS technologies where metal-insulator-metal (MIM) capacitors are available for capacitor Cs. These capacitors have the same area efficiency as the standard poly-insulator-poly (PIP) capacitors but have negligible bottom plate parasitic capacitances. Parasitic capacitances $C_P$ are, therefore, not shown. Otherwise, the circuits are the same. It is obvious to those skilled in the art that the above serial combination of a first series resistive means 61 (Rs/2), a MIM capacitor Cs, and a second series resistive means 62 (Rs/2) is equally applicable to the multistage high frequency fixed gain differential amplifier (FIG. 6) and the multistage high frequency variable gain differential amplifier (FIG. 8a and FIG. 8b).

Figure 11:
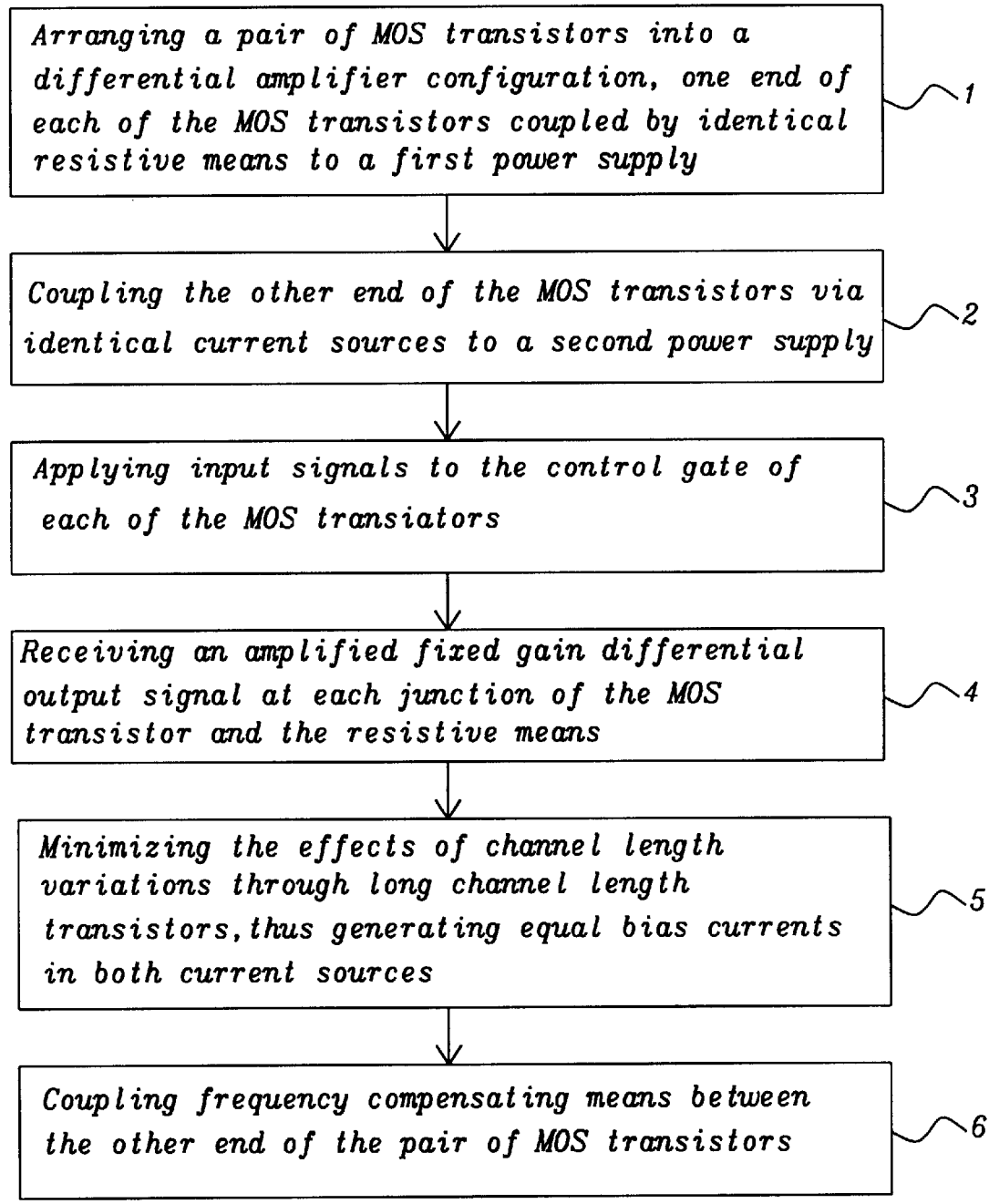
FIG. 11 is a block diagram of the method of providing a high frequency fixed gain differential amplifier.

With reference to FIG. 11, we now describe the method of creating a high frequency fixed gain differential amplifier, as illustrated in FIG. 5, which has bias currents exactly equal to $I_0/2$ for each of the two transistors M1 and M2, has no DC offset at the outputs, is not sensitive to DC offsets at the inputs and maintains good CMRR.

In BLOCK 1 a pair of MOS transistors is arranged into a differential amplifier configuration, where one end of each of the MOS transistors is coupled by identical resistive means to a first power supply.

In BLOCK 2 the other end of each of the MOS transistors is coupled via identical current sources to a second power supply.

In BLOCK 3 input signals are applied to the control gate of each of the MOS transistors.

In BLOCK 4 an amplified fixed gain differential output signal is received at each junction of the MOS transistor and the resistive means.

BLOCK 5 describes that by minimizing the effects of channel length variations through long channel length transistors of the current sources equal bias currents are generated in both current sources.

In BLOCK 6 frequency compensating means are coupled between the other end (bottom end) of the pair of MOS transistors. Frequency compensating means may comprise capacitive means coupled serially with resistive means, or capacitive means only.

Figure 12:
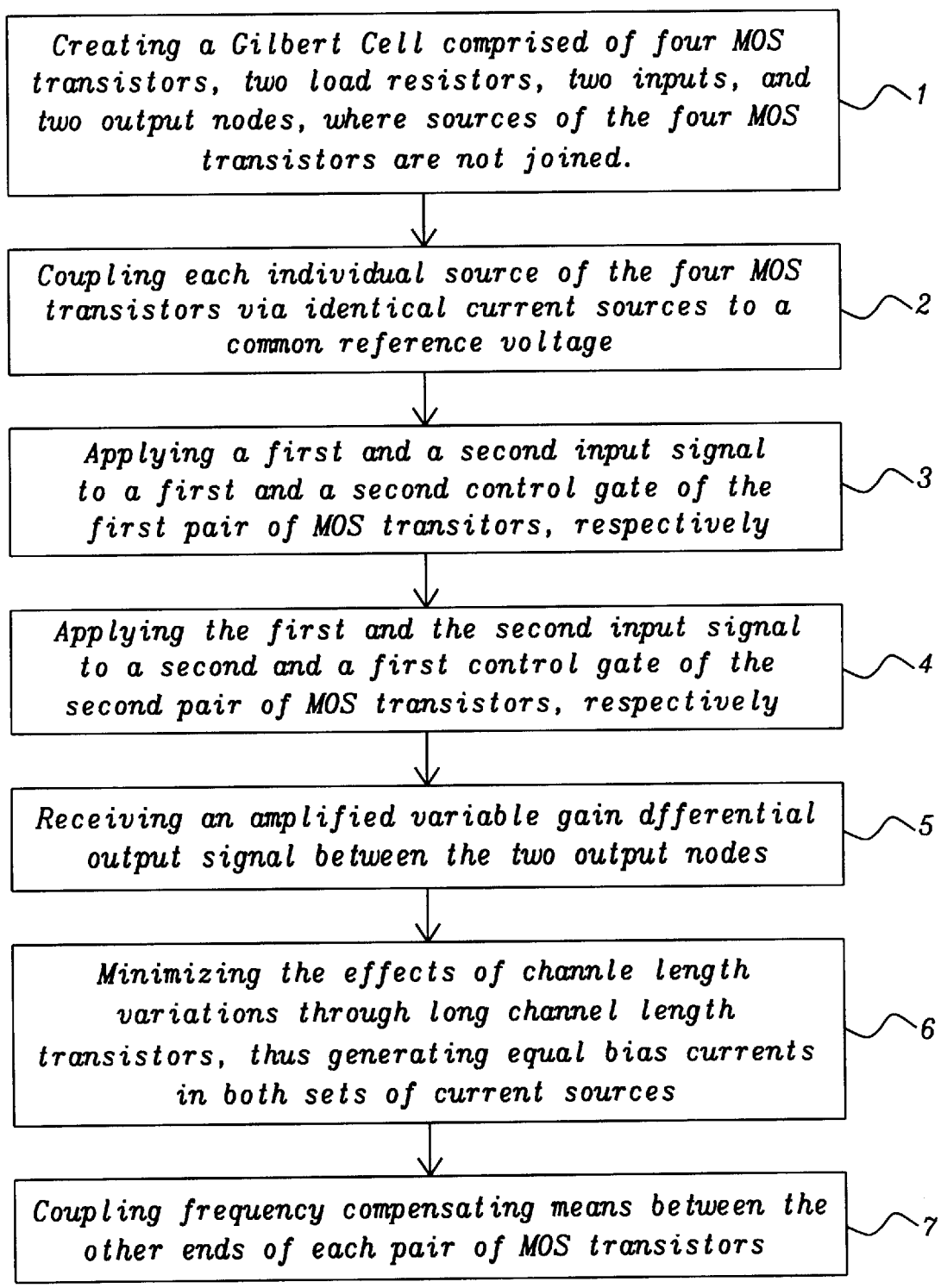
FIG. 12 is a block diagram of the method of providing a high frequency variable gain differential amplifier.

With reference to FIG. 12, we now describe the method of creating a high frequency variable gain differential amplifier, as illustrated in FIG. 7, which has bias currents exactly equal to $(I_0+\Delta I_0)/2$ for each of the two transistors M1 and M2 of a first differential amplifier stage and bias currents exactly equal to $(I_0-\Delta I_0)/2$ for each of the two transistors M3 and M4 for a second differential amplifier stage, has no DC offset at the outputs, is not sensitive to DC offsets at the inputs and maintains good CMRR.

BLOCK 1 creates a Gilbert Cell comprised of four MOS transistors (two pairs), two load resistors, two inputs, and two output nodes, where sources (if NMOS transistors) of the four MOS transistors are not joined.

In BLOCK 2 each individual source of the four MOS transistors is coupled via identical current sources to a common reference voltage.

In BLOCK 3 the first and the second input signal is applied to a first and a second control gate of the second pair of MOS transistors, respectively.

In BLOCK 4 the first and the second input signal is applied to a second and a first control gate of the second pair of MOS transistors, respectively.

In BLOCK 5 an amplified variable gain differential output signal is received between the two output nodes.

BLOCK 6 describes that by minimizing the effects of channel length variations through long channel length transistors of the current sources equal bias currents are generated in both sets of current sources.

In BLOCK 7 frequency compensating means are coupled between the other end of each pair of MOS transistors. Frequency compensating means may comprise capacitive means coupled serially with resistive means, or capacitive means only.

Regarding FIG. 11 and FIG. 12, it is understood by those skilled in the art that, aside from NMOS transistors, PMOS transistors could be used as well, in which case sources will be substituted by drains and vice versa. Other types of switching devices can be used as well such as, but not limited to, npn or pnp bipolar transistors. The term channel length with reference to current sources will then have to be replaced by an equivalent device parameter.

While the invention has been particularly shown and described with reference to the preferred embodiments thereof, it will be understood by those skilled in the art that various changes in form and details may be made without departing from the spirit and scope of the invention.

What is claimed is:

1. A high frequency fixed gain differential amplifier, comprising:

a first switching means of a first conductivity type having a first and a second terminal, said first terminal of said first switching means coupled via a first load resistive means to a first power supply, the junction of said first terminal of said first switching means and said first load resistive means providing a first output;

said second terminal of said first switching means coupled via a first current source to a second power supply less positive than said first power supply;

a second switching means, identical to said first switching means, having a first and a second terminal, said first terminal of said second switching means coupled via a second load resistive means, equal in resistance to said first load resistive means, to said first power supply, the junction of said first terminal of said second switching means and said second resistive means providing a second output, where said first and said second output provide a fixed gain differential output signal based on a first and a second input signal applied to a first and a second input terminal;

said second terminal of said second switching means coupled via a second current source, identical to said first current source, to said second power supply;

a control gate of said first switching means in communication with said first input terminal;

a control gate of said second switching means in communication with said second input terminal;

frequency compensating means in communication with said second terminal of said first and said second switching means, said frequency compensating means comprising resistive means serially coupled with a capacitive means, where the impedance of said capacitive means is smaller than the impedance of said resistive means at the desired signal frequency;

a first parasitic capacitance coupled between said second terminal of said first switching means and said second power supply; and a second parasitic capacitance coupled between said second terminal of said second switching means and said second power supply, said first and said second parasitic capacitance reducing the impedance at said second terminal of said first and said second switching means.

2. The circuit of claim 1, wherein currents through said first and said second current source are made to match by making the channel length of said first and second current source larger than of said first and said second switching means.

3. The circuit of claim 1, wherein for equal drain current, differences in the transconductance $g_m$ of said first and said second switching means do not vary by more than 2.5% for a 5% difference in the length of said first and said second switching means.

4. The circuit of claim 1, wherein said switching means of said first conductivity type are substituted by a second conductivity type, where said first and said second conductivity types are opposite conductivity types.

5. A high frequency fixed gain differential metal oxide semiconductor (MOS) amplifier, comprising:

a first MOS transistor of a first conductivity type having a first terminal and a second terminal, said first terminal of said first MOS transistor coupled via a first load resistive means to a first power supply, the junction of said first terminal of said first MOS transistor and said first load resistive means providing a first output;

said second terminal of said first MOS transistor coupled via a first current source to a second power supply less positive than said first power supply;

a second MOS transistor, identical to said first MOS transistor, having a first terminal and a second terminal, said first terminal of said second MOS transistor coupled via a second load resistive means, equal in resistance to said first load resistive means, to said first power supply, the junction of said first terminal of said second MOS transistor and said second load resistive means providing a second output, where said first and said second output provides a fixed gain differential output signal based on a first and a second input signal applied to a first and a second input terminal;

said second terminal of said second MOS transistor coupled via a second current source, identical to said first current source, to said second power supply;

the gate of said first MOS transistor in communication with said first input terminal;

the gate of said second MOS transistor in communication with said second input terminal;

frequency compensating means in communication with said second terminal of said first and said second MOS transistor, said frequency compensating means further comprising:

a first series resistive means serially coupled to a first capacitive means, where said first series resistive means is coupled to said second terminal of said second MOS transistor, and a plate of said first capacitive means is coupled to said second terminal of said first MOS transistor; and a second series resistive means serially coupled to a second capacitive means, where said second series resistive means is coupled to said second terminal of said first MOS transistor, and a plate of said second capacitive means is coupled to said second terminal of said second MOS transistor;

a first parasitic capacitance coupled between said plate of said first capacitive means and said second power supply; and a second parasitic capacitance coupled between said plate of said second capacitive means and said second power supply, said first and said second parasitic capacitance reducing the impedance at the second terminal of said first and said second MOS transistor.

6. The circuit of claim 5, wherein currents through said first and said second current source are made to match by using long channel lengths in said first and second current source.

7. The circuit of claim 5, wherein for equal drain current, differences in the transconductance $g_m$ of said first and said second switching means do not vary by more than 2.5% for a 5% difference in the length of said first and said second switching means.

8. The circuit of claim 5, wherein said switching means of said first conductivity type are substituted by a second conductivity type, where said first and said second conductivity types are opposite conductivity types.

9. The circuit of claim 5, wherein the impedance of said capacitive means is smaller than the impedance of said resistive means at the desired signal frequency.

10. A multistage high frequency fixed gain differential metal oxide semiconductor (MOS) amplifier, comprising:

inputs (In1) and (In2) and outputs (Out1) and (Out2), and a first and a second differential amplifier stage, each of said first and second differential amplifier stages having an input (G1) and an input (G2) and outputs node (A) and node (B), where said input (G1) and said input (G2) of said first differential amplifier stage is coupled to said input (In1) and said input (In2), respectively, where said input (G1) and said input (G2) of said second differential amplifier stage is direct-coupled to said node (A) and said node (B) of said first differential amplifier stage, respectively, where said node (A) and said node (B) of said second differential amplifier stage is coupled to said output (Out1) and said output (Out2), respectively, said first and said second differential amplifier stage together providing a fixed gain at said outputs (Out1) and (Out2) based on signals applied to said inputs (In1) and (In2), said first and said second differential amplifier stage each further comprising:

a first MOS transistor of a first conductivity type having a first terminal and a second terminal, said first terminal of said first MOS transistor coupled via a first load resistive means to a first power supply, the junction of said first terminal of said first MOS transistor and said first load resistive means labeled node (A);

said second terminal of said first MOS transistor coupled via a first current source to a second power supply less positive than said first power supply;

a second MOS transistor, identical to said first MOS transistor, having a first terminal and a second terminal, said first terminal of said second MOS transistor coupled via a second load resistive means, equal in resistance to said first load resistive means, to said first power supply, the junction of said first terminal of said second MOS transistor and said second load resistive means labeled node (B), where said node (A) and said node (B) provides a differential output signal based on said inputs (G1) and (G2);

said second terminal of said second MOS transistor coupled via a second current source, identical to said first current source, to said second power supply;

the gate of said first MOS transistor coupled to said input (G1);

the gate of said second MOS transistor coupled to said input (G2);

frequency compensating means in communication with said second terminal of said first and said second MOS transistor, said frequency compensating means further comprising:

a first series resistive means serially coupled to a first capacitive means, where said first series resistive means is coupled to said second terminal of said second MOS transistor, and a plate of said first capacitive means is coupled to said second terminal of said first MOS transistor; and a second series resistive means serially coupled to a second capacitive means, where said series second resistive means is coupled to said second terminal of said first MOS transistor, and a plate of said second capacitive means is coupled to said second terminal of said second MOS transistor;

a first parasitic capacitance coupled between said plate of said first capacitive means and said second power supply; and a second parasitic capacitance coupled between said plate of said second capacitive means and said second power supply, said first and said second parasitic capacitance reducing the impedance at the second terminal of said first and said second MOS transistor.

11. The circuit of claim 10, wherein currents through said first and said second current source are made to match by using long channel lengths in said first and second current source.

12. The circuit of claim 10, wherein for equal drain current, differences in the transconductance $g_m$ of said first and said second switching means do not vary by more than 2.5% for a 5% difference in the length of said first and said second switching means.

13. The circuit of claim 10, wherein said switching means of said first conductivity type are substituted by a second conductivity type, where said first and said second conductivity types are opposite conductivity types.

14. The circuit of claim 10, wherein the impedance of said capacitive means is smaller than the impedance of said resistive means at the desired signal frequency.

15. A high frequency variable gain differential metal oxide semiconductor (MOS) amplifier, comprising:

a first and a second differential amplifier stage, each having an input (G1) and an input (G2) and outputs node (A) and node (B), said nodes (A) coupled together and said nodes (B) coupled together, where said input (G1) and said input (G2) of said first differential amplifier stage is coupled to an input (In1) and an input (In2), respectively, where said input (G1) and said input (G2) of said second differential amplifier stage is coupled to said input (In2) and said input (In1), respectively, where said node (B) is coupled to an output (Out1) and where said node (A) is coupled to an output (Out2), said first and said second differential amplifier stage together providing a variable gain at said outputs (Out1) and (Out2) based on signals applied to said inputs (In1) and (In2), said first and said second differential amplifier stage each further comprising:

a first MOS transistor of a first conductivity type having a first and a second terminal, said first terminal of said first MOS transistor coupled via a first load resistive means to a first power supply, the junction of said first terminal of said first MOS transistor and said first load resistive means labeled node (A);

said second terminal of said first MOS transistor coupled via a first current source to a second power supply less positive than said first power supply;

a second MOS transistor, identical to said first MOS transistor, having a first and a second terminal, said first terminal of said second MOS transistor coupled via a second load resistive means, equal in resistance to said first load resistive means, to said first power supply, the junction of said first terminal of said second MOS transistor and said second load resistive means labeled node (B), where said node (A) and said node (B) provides a differential output signal based on said inputs (G1) and (G2);

said second terminal of said second MOS transistor coupled via a second current source, identical to said first current source, to said second power supply;

the gate of said first MOS transistor coupled to said input (G1);

the gate of said second MOS transistor coupled to said input (G2);

frequency compensating means in communication with said second terminal of said first and said second MOS transistor, said frequency compensating means further comprising:

a first series resistive means serially coupled to a first capacitive means, where said first series resistive means is coupled to said second terminal of said second MOS transistor, and a plate of said first capacitive means is coupled to said second terminal of said first MOS transistor; and a second series resistive means serially coupled to a second capacitive means, where said second series resistive means is coupled to said second terminal of said first MOS transistor, and a plate of said second capacitive means is coupled to said second terminal of said second MOS transistor;

a first parasitic capacitance coupled between said plate of said first capacitive means and said second power supply; and a second parasitic capacitance coupled between said plate of said second capacitive means and said second power supply, said first and said second parasitic capacitance reducing the impedance at said second terminal of said first and said second MOS transistor.

16. The circuit of claim 15, wherein currents through said first and said second current source are made to match by using long channel lengths in said first and second current source.

17. The circuit of claim 15, wherein the aspect ratio, defined as the ratio of width over length of a MOS transistor channel, of said first MOS transistor of said first differential amplifier stage over said second MOS transistor of said first differential amplifier stage is larger than the aspect ration of said first MOS transistor of said second differential amplifier stage over said second MOS transistor of said second differential amplifier stage.

18. The circuit of claim 15, wherein for equal drain current, differences in the transconductance $g_m$ of said first and said second switching means do not vary by more than 2.5% for a 5% difference in the length of said first and said second switching means.

19. The circuit of claim 15, wherein said switching means of said first conductivity type are substituted by a second conductivity type, where said first and said second conductivity types are opposite conductivity types.

20. The circuit of claim 15, wherein the gain of said first differential amplifier stage is varied by varying the current ($I_O$) in each of said first and second current sources of said first differential amplifier stage in the positive direction.

21. The circuit of claim 15, wherein the gain of said second differential amplifier stage is varied by varying the current ($I_O$) in each of said first and second current sources of said second differential amplifier stage in the negative direction.

22. The circuit of claim 15, wherein the impedance of said capacitive means is smaller than the impedance of said resistive means at the desired signal frequency.

23. A multistage high frequency variable gain differential amplifier, comprising:
a first and a second variable gain differential amplifier, each having an input (X) and an input (Y) and outputs node (A) and node (B), where said input (X) and said input (Y) of said first variable gain differential amplifier is coupled to an input (In1) and an input (In2), respectively, where said input (X) and said input (Y) of said second variable gain differential amplifier is direct-coupled to said node (B) and said node (A) of said first variable gain differential amplifier, respectively, where said node (B) and said node (A) of said second variable gain differential amplifier is coupled to an output (Out1) and an output (Out2), respectively, said first and said second variable gain differential amplifier together providing a variable gain at said outputs (Out1) and (Out2) based on signals applied to said inputs (In1) and (In2), said first and said second variable gain differential amplifier each further comprising:
a first and a second differential amplifier stage coupled together, each having an input (G1) and an input (G2) and said node (A) and said node (B), said nodes (A) coupled together and said nodes (B) coupled together, where said input (G1) and said input (G2) of said first differential amplifier stage are coupled to an input (X) and an input (Y), respectively, where said input (G1) and said input (G2) of said second differential amplifier stage is coupled to said input (Y) and said input (X), respectively, said first and said second differential amplifier stage together providing a variable gain at said node (A) and said node (B), based on signals applied to said input (X) and said input (Y), said first and said second differential amplifier stage each further comprising:
a first MOS transistor of a first conductivity type having a first and a second terminal, said first terminal of said first MOS transistor coupled via a first load resistive means to a first power supply, the junction of said first terminal of said first MOS transistor and said first load resistive means labeled said node (A);
said second terminal of said first MOS transistor coupled via a first current source to a second power supply less positive than said first power supply;
a second MOS transistor, identical to said first MOS transistor, having a first and a second terminal, said first terminal of said second MOS transistor coupled via a second load resistive means, equal in resistance to said first load resistive means, to said first power supply, the junction of said first terminal of said second MOS transistor and said second resistive means labeled said node (B), where said node (A) and said node (B) provides a differential output signal based on said inputs (G1) and (G2);
said second terminal of said second MOS transistor coupled via a second current source, identical to said first current source, to said second power supply;
the gate of said first MOS transistor coupled to said input (G1);
the gate of said second MOS transistor coupled to said input (G2);
frequency compensating means in communication with said second terminal of said first and said second MOS transistor, where said frequency compensating means further comprises:
a first series resistive means serially coupled to a first capacitive means, where said first series resistive means is coupled to said second terminal of said second MOS transistor, and a plate of said first capacitive means is coupled to said second terminal of said first MOS transistor; and
a second series resistive means serially coupled to a second capacitive means, where said series second resistive means is coupled to said second terminal of said first MOS transistor, and a plate of said second capacitive means is coupled to said second terminal of said second MOS transistor;
a first parasitic capacitance coupled between said plate of said first capacitive means and said second power supply; and
a second parasitic capacitance coupled between said plate of said second capacitive means and said second power supply, said first and said second parasitic capacitance reducing the impedance at said second terminal of said first and said second MOS transistor.

24. The circuit of claim 23, wherein currents through said first and said second current source are made to match by using long channel lengths in said first and second current source.

25. The circuit of claim 23, wherein the aspect ratio, defined as the ratio of width over length of a MOS transistor channel, of said first MOS transistor of said first differential amplifier stage over said second MOS transistor of said first differential amplifier stage is larger than the aspect ration of said first MOS transistor of said second differential amplifier stage over said second MOS transistor of said second differential amplifier stage.

26. The circuit of claim 23, wherein for equal drain current, differences in the transconductance $g_m$ of said first and said second switching means do not vary by more than 2.5% for a 5% difference in the length of said first and said second switching means.

27. The circuit of claim 23, wherein said switching means of said first conductivity type are substituted by a second conductivity type, where said first and said second conductivity types are opposite conductivity types.

28. The circuit of claim 23, wherein the impedance of said capacitive means is smaller than the impedance of said resistive means at the desired signal frequency.

29. A high frequency fixed gain differential metal oxide semiconductor (MOS) amplifier, comprising:

a first MOS transistor of a first conductivity type having a first terminal and a second terminal, said first terminal of said first MOS transistor coupled via a first load resistive means to a first power supply, the junction of said first terminal of said first MOS transistor and said first load resistive means providing a first output;

said second terminal of said first MOS transistor coupled via a first current source to a second power supply less positive than said first power supply;

a second MOS transistor, identical to said first MOS transistor, having a first terminal and a second terminal, said first terminal of said second MOS transistor coupled via a second load resistive means, equal in resistance to said first load resistive means, to said first power supply, the junction of said first terminal of said second MOS transistor and said second load resistive means providing a second output, where said first and said second output provides a fixed gain differential output signal based on a first and a second input signal applied to a first and a second input terminal;

said second terminal of said second MOS transistor coupled via a second current source, identical to said first current source, to said second power supply;

the gate of said first MOS transistor in communication with said first input terminal;

the gate of said second MOS transistor in communication with said second input terminal;

frequency compensating means in communication with said second terminal of said first and said second MOS transistor, where said frequency compensating means further comprises:

a serial combination of a first series resistive means, a capacitive means, and a second series resistive means, respectively;

a first parasitic capacitance coupled between said plate of said first capacitive means and said second power supply; and a second parasitic capacitance coupled between said plate of said second capacitive means and said second power supply, said first and said second parasitic capacitance reducing the impedance at the second terminal of said first and said second MOS transistor.

30. The circuit of claim 29, wherein said capacitive means is a metal-insulator-metal (MIM) capacitor having a negligible bottom plate parasitic capacitance.

31. The circuit of claim 29, wherein currents through said first and said second current source are made to match by using long channel lengths in said first and second current source.

32. The circuit of claim 29, wherein for equal drain current, differences in the transconductance $g_m$ of said first and said second switching means do not vary by more than 2.5% for a 5% difference in the length of said first and said second switching means.

33. The circuit of claim 29, wherein said switching means of said first conductivity type are substituted by a second conductivity type, where said first and said second conductivity types are opposite conductivity types.

34. A high frequency variable gain differential metal oxide semiconductor (MOS) amplifier, comprising:

a first and a second differential amplifier stage, each having an input (G1) and an input (G2) and outputs node (A) and node (B), said nodes (A) coupled together and said nodes (B) coupled together, where said input (G1) and said input (G2) of said first differential amplifier stage is coupled to an input (In1) and an input (In2), respectively, where said input (G1) and said input (G2) of said second differential amplifier stage is coupled to said input (In2) and said input (In1), respectively, where said node (B) is coupled to an output (Out1) and where said node (A) is coupled to an output (Out2), said first and said second differential amplifier stage together providing a variable gain at said outputs (Out1) and (Out2) based on signals applied to said inputs (In1) and (In2), said first and said second differential amplifier stage each further comprising:

a first MOS transistor of a first conductivity type having a first and a second terminal, said first terminal of said first MOS transistor coupled via a first load resistive means to a first power supply, the junction of said first terminal of said first MOS transistor and said first load resistive means labeled node (A);

said second terminal of said first MOS transistor coupled via a first current source to a second power supply less positive than said first power supply;

a second MOS transistor, identical to said first MOS transistor, having a first and a second terminal, said first terminal of said second MOS transistor coupled via a second load resistive means, equal in resistance to said first load resistive means, to said first power supply, the junction of said first terminal of said second MOS transistor and said second load resistive means labeled node (B), where said node (A) and said node (B) provides a differential output signal based on said inputs (G1) and (G2);

said second terminal of said second MOS transistor coupled via a second current source, identical to said first current source, to said second power supply;

the gate of said first MOS transistor coupled to said input (G1);

the gate of said second MOS transistor coupled to said input (G2);

frequency compensating means in communication with said second terminal of said first and said second MOS transistor, where said frequency compensating means further comprises:

a serial combination of a first series resistive means , a capacitive means, and a second series resistive means, respectively;

a first parasitic capacitance coupled between said plate of said first capacitive means and said second power supply; and a second parasitic capacitance coupled between said plate of said second capacitive means and said second power supply, said first and said second parasitic capacitance reducing the impedance a t said second terminal of said first and said second MOS transistor.

35. The circuit of claim 34, wherein said capacitive means is a metal-insulator-metal (MIM) capacitor having a negligible bottom plate parasitic capacitance.

36. The circuit of claim 34, wherein currents through said first and said second current source are made to match by using long channel lengths in said first and second current source.

37. The circuit of claim 34, wherein the aspect ratio, defined as the ratio of width over length of a MOS transistor channel, of said first MOS transistor of said first differential amplifier stage over said second MOS transistor of said first differential amplifier stage is larger than the aspect ration of said first MOS transistor of said second differential amplifier stage over said second MOS transistor of said second differential amplifier stage.

38. The circuit of claim 34, wherein for equal drain current, differences in the transconductance $g_m$ of said first and said second switching means do not vary by more than 2.5% for a 5% difference in the length of said first and said second switching means.

39. The circuit of claim 34, wherein said switching means of said first conductivity type are substituted by a second conductivity type, where said first and said second conductivity types are opposite conductivity types.

40. The circuit of claim 34, wherein the gain of said first differential amplifier stage is varied by varying the current ($I_0$) in each of said first and second current sources of said first differential amplifier stage in the positive direction.

41. The circuit of claim 34, wherein the gain of said second differential amplifier stage is varied by varying the current ($I_0$) in each of said first and second current sources of said second differential amplifier stage in the negative direction.

* * * * *